(12) United States Patent
Chuang et al.

(10) Patent No.: US 6,847,068 B2
(45) Date of Patent: Jan. 25, 2005

(54) FLOATING GATE AND FABRICATION METHOD THEREFOR

(75) Inventors: Ying-Cheng Chuang, Bade (TW); Chung-Lin Huang, Taichung (TW); Chi-Hui Lin, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/441,801

(22) Filed: May 19, 2003

(65) Prior Publication Data

US 2004/0016955 A1 Jan. 29, 2004

(30) Foreign Application Priority Data

Jul. 26, 2002 (TW) ........................................ 91116811 A

(51) Int. Cl.[7] ........................................ H01L 21/8242
(52) U.S. Cl. ........................ 257/260; 438/257; 438/259; 438/593; 438/596
(58) Field of Search ................................ 438/257, 259, 438/260, 267, 304, 593, 596

(56) References Cited

U.S. PATENT DOCUMENTS

| | | | | |
|---|---|---|---|---|
| 5,765,384 A | * | 6/1998 | Carlstedt et al. | 62/276 |
| 6,261,903 B1 | * | 7/2001 | Chang et al. | 438/257 |
| 6,331,464 B1 | * | 12/2001 | Liou et al. | 438/257 |
| 6,344,393 B1 | * | 2/2002 | Liu | 438/259 |
| 6,355,525 B1 | * | 3/2002 | Nakagawa | 438/257 |
| 6,482,700 B2 | * | 11/2002 | Chen et al. | 438/267 |
| 6,537,880 B1 | * | 3/2003 | Tseng | 438/260 |
| 6,562,673 B2 | * | 5/2003 | Lin | 438/211 |
| 6,620,687 B2 | * | 9/2003 | Tseng | 438/260 |
| 6,649,475 B1 | * | 11/2003 | Wen et al. | 438/267 |
| 6,653,188 B1 | * | 11/2003 | Huang et al. | 438/257 |
| 6,706,592 B2 | * | 3/2004 | Chern et al. | 438/257 |
| 6,740,557 B1 | * | 5/2004 | Lin | 438/267 |

* cited by examiner

Primary Examiner—Tom Thomas
Assistant Examiner—N. Drew Richards
(74) Attorney, Agent, or Firm—Ladas & Parry LLP

(57) ABSTRACT

A floating gate with multiple tips and a fabrication method thereof. A semiconductor substrate is provided, on which a patterned hard mask layer is formed, wherein the patterned hard mask layer has an opening. A gate dielectric layer and a first conducting layer with a first predetermined thickness are formed on the bottom of the opening. A spacer is formed on the sidewall of the opening. A conducting spacer is formed on the sidewall of the spacer. The first conducting layer is etched to a second predetermined thickness. A multi-tip floating gate is provided by the first conducting layer and the conducting spacer. A protecting layer is formed in the opening. The patterned hard mask layer, the gate dielectric layer, a portion of the protecting layer, and a portion of the first spacer are etched to expose the surface of the first conducting layer.

19 Claims, 6 Drawing Sheets

FLOATING GATE AND FABRICATION METHOD THEREFOR

BACKGROUND OF THE INVENTION

1. Field of the Invention

The invention is relates to a floating gate, and more particularly to a floating gate with multiple tips and a fabrication method thereof.

2. Description of the Related Art

Memory devices for non-volatile storage of information are currently in widespread use, in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

An advantage of EPROM is electrical programmability, but for erasing, EPROM requires exposure to ultraviolet (UV) light.

In many circuit designs it is desirable to have a non-volatile memory device that can be erased and reprogrammed in-circuit, without the need to remove the device.

EEPROM devices have the advantage of electrical programming and erasing, achieved by charging and discharging actions controlled by the control gate. The actions also affect the conductivity of the channel between source and drain.

One of the advantages of flash memory is its capacity for block-by-block memory erasure. Furthermore, memory erasure is fast, normally taking just 1 to 2 seconds for the complete removal of a whole block of memory. Another advantage of the flash memory is low power consumption. The voltages of a control gate, a source, and a drain are adjusted to program or erase in a split gate flash memory.

FIGS. 1a to 1c are cross-sections of the conventional method of fabricating a floating gate of a split gate flash memory.

In FIG. 1a, a silicon substrate 101 is provided. A gate oxide layer 102, a doped polysilicon layer 103, and a nitride layer 104 having an opening 105 are sequentially formed on the silicon substrate 101.

In FIG. 1b, the doped polysilicon layer 105 exposed by the opening 105 is oxidized to form an oxide layer 106 with a Bird's Beak shape edge.

In FIG. 1c, the nitride layer 104 is removed. The doped polysilicon layer 103 is anisotropically etched to form a floating gate 103a using the oxide layer 106 as an etching mask.

A split gate flash memory is completed after a control gate is formed on the floating gate and the silicon substrate 101 is implanted to form source/drain devices.

In the program step, high voltage is applied between the source and drain. Another high voltage is applied to the control gate and goes to the floating gate because of the electric capacity coupling, and a high electric field is produced on the film gate oxide layer. The electricity is injected into the floating gate through the film gate oxide layer from the drain.

In the erase step, a high voltage is applied between the drain and the control gate. A high electric field is produced on the film gate oxide layer because of the electric capacity coupling. The electricity injects into the drain through the film gate oxide layer from the floating gate, such that the gate oxide layer is damaged by the high voltage.

When the edge of the floating gate is a tip, the electric field is easily concentrated in the tip, and the point is easily discharged. If the point discharge is increased, the erase effect is strong.

In addition, die size is larger due to the addition of programming circuitry and there are more processing and testing steps involved in the manufacture of these types of memory devices.

SUMMARY OF THE INVENTION

The present invention is directed to a floating gate with multiple tips and a fabrication method thereof.

Accordingly, the present invention provides a method for forming a floating gate. A semiconductor substrate is provided. A patterned hard mask layer with an opening is formed on the semiconductor substrate. A gate dielectric layer and a first conducting layer with a first predetermined thickness are formed on the bottom of the opening. A spacer is formed on the sidewall of the opening. A conducting spacer is formed on the sidewall of the spacer. The first conducting layer is etched to a second predetermined thickness. A multi-tip floating gate is provided by the first conducting layer and the conducting spacer. A protecting layer is formed in the opening. The patterned hard mask layer is removed. The gate dielectric layer, the portion of the protecting layer, and the portion of the first spacer are removed to expose the surface of the first conducting layer.

Accordingly, the present invention also provides a method for forming a floating gate. A semiconductor substrate is provided, with a dielectric layer, a hard mask layer, and a patterned resist layer sequentially formed thereon. The hard mask layer is etched to form an opening using the patterned resist layer as a mask, wherein the opening exposes the surface of the semiconductor substrate. The patterned resist layer is removed. A gate dielectric layer is formed on the exposed surface of the semiconductor substrate. A first poly layer is formed on the hard mask layer, and the opening is filled with the first poly layer. The first poly layer is chemical mechanical polished to expose the surface of the hard mask layer. The first poly layer in the opening is etched to a first predetermined thickness. An insulating layer is conformally formed on the surface of the hard mask layer and the opening. The insulating layer is anisotropically etched to form a first spacer on the sidewall of the opening. A second poly layer is conformally formed on the surface of the hard mask layer and the opening. The second poly layer is anisotropically etched to form a second spacer on the sidewall of the first spacer, wherein the second spacer covers the surface of the first spacer. The first conducting layer is etched to a second predetermined thickness. A multi-tip floating gate is provided by the first conducting layer and the second spacer. A protecting layer is formed in the opening. The patterned resist layer is removed. A protecting layer is formed in the opening. The patterned resist layer, the first oxide layer, the portion of the protecting layer, and the portion of the first spacer are removed to expose the surface of the first conducting layer.

Accordingly, the present invention provides a floating gate. The floating gate comprises a conductive base and a conductive protruding layer, wherein the edge of the conductive base is tip-shaped, and the conductive protruding layer is crescent-shaped. The crescent-shaped structure is aligned with the tip-shaped structure, the bottom portion of the conductive protruding layer is narrower than the top portion of the conductive base, and a multi-tip floating gate is provided by the conductive base and the conductive protruding layer.

Accordingly, the present invention also provides a floating gate. The floating gate comprises a conductive base and a conductive protruding layer. The top edge of the conductive base is tip-shaped. The conductive base has a first sidewall and a second sidewall, wherein the first sidewall is parallel to the second sidewall. The conductive protruding layer is crescent-shaped, wherein the crescent-shaped structure is aligned with the tip-shaped structure. The bottom portion of the conductive protruding layer connects to the top portion of the conductive base, wherein the bottom portion of the conductive protruding layer is narrower than the conductive base, and a multi-tip floating gate is provided by the conductive base and the conductive protruding layer.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

A method for forming a multi-tip floating gate according to the present invention is shown in FIGS. 2a to 2m.

Figure 1A:
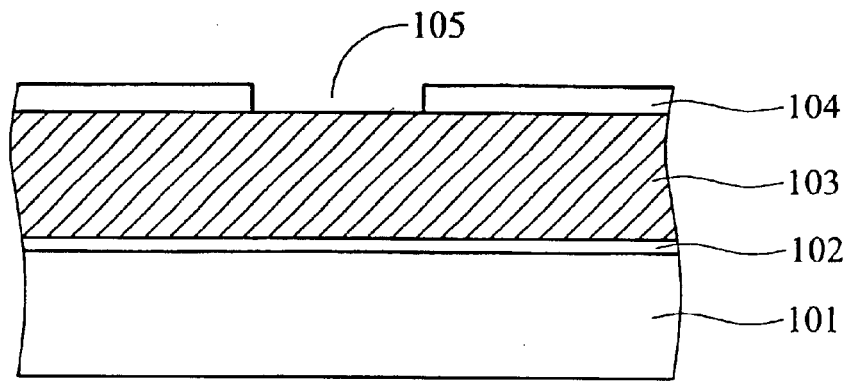
FIGS. 1a to 1c are cross-sections of a conventional method for fabricating a floating gate of a split gate flash memory.
Figure 1B:
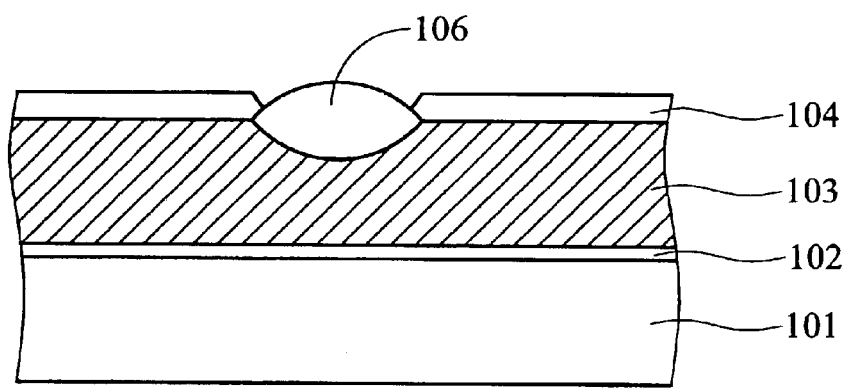
Figure 1C:
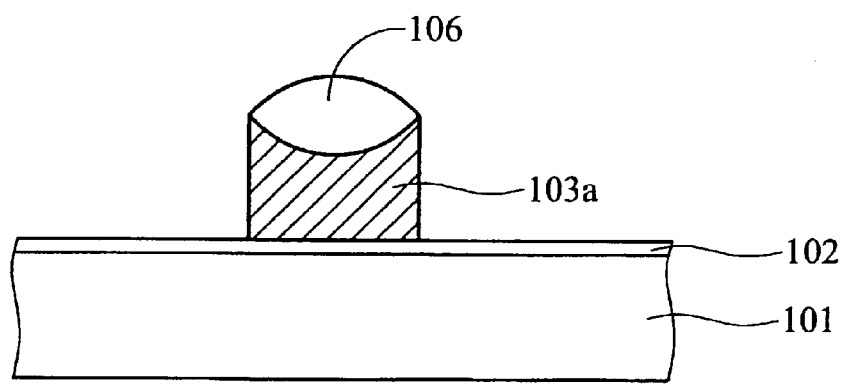
Figure 2A:
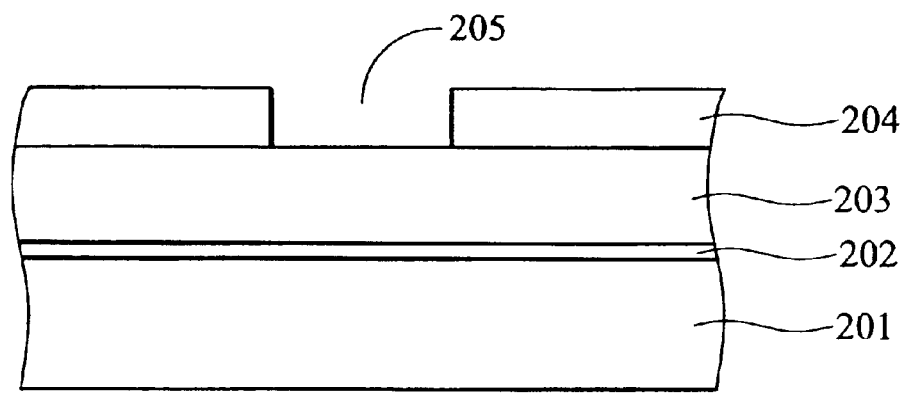
FIGS. 2a to 2m are cross-sections of a method for fabricating a floating gate of a split gate flash memory of the present invention.

In FIG. 2a, a semiconductor substrate 201, such as silicon substrate, is provided. A dielectric layer 202, such as pad oxide layer, a hard mask layer 203, such as silicon nitride layer, and a patterned resist layer 204 having an opening 205 are sequentially formed on the surface of the semiconductor substrate 201, wherein a multi-tip floating gate is formed in the opening 205 in subsequent process. The surface of the hard mask layer 203 is exposed by the opening 205.

Figure 2B:
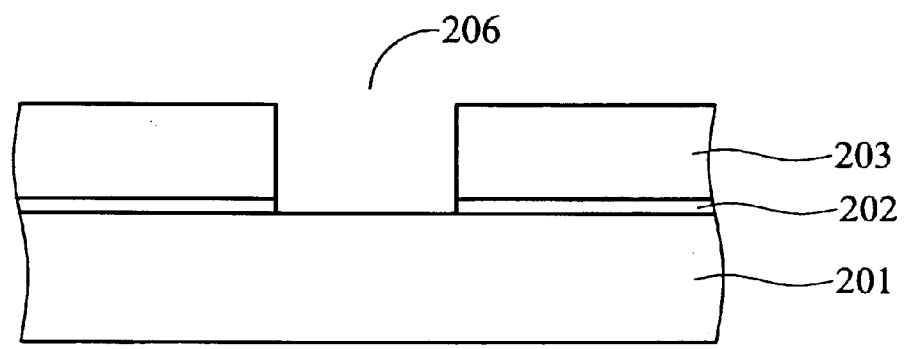

In FIG. 2b, the hard mask layer 203 and the dielectric layer are sequentially etched to form an opening 206 using the patterned resist layer 204 as a mask, and the opening 206 exposes the surface of the semiconductor substrate 201.

Figure 2C:
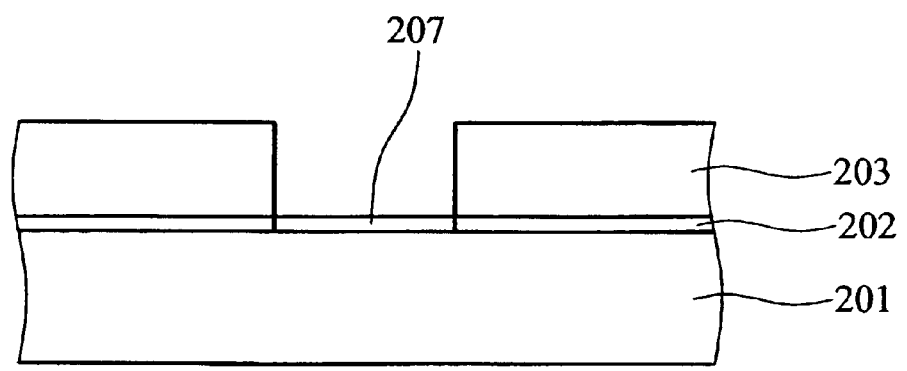

In FIG. 2c, a gate dielectric layer 207, such as gate oxide layer, is formed on the exposed surface of the semiconductor substrate 201. The gate oxide layer is a high quality oxide layer, and the gate oxide layer is usually formed by thermal oxidation.

Figure 2D:
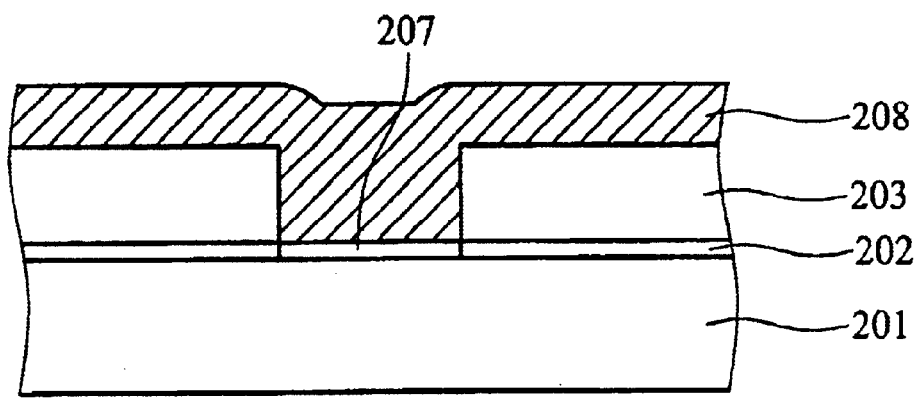

In FIG. 2d, a first conducting layer 208, such as a poly layer, is formed on the surface of the hard mask layer 203, wherein the opening 206 is filled with the first conducting layer 208.

Figure 2E:
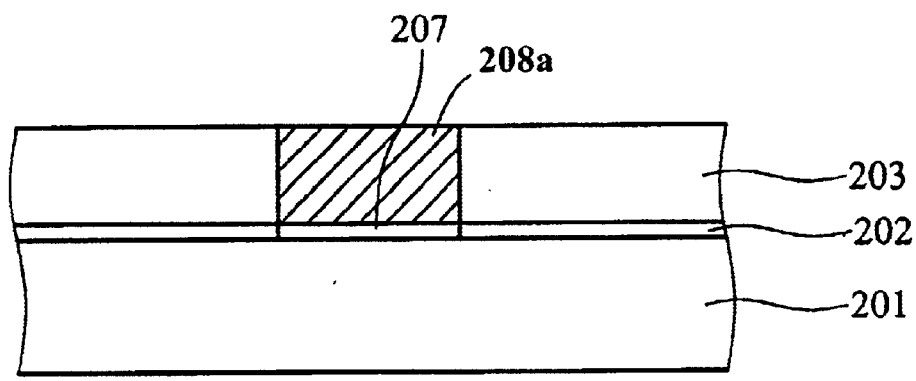

In FIG. 2e, the first conducting layer 208 is planarized to expose the surface of the hard mask layer 203, and the first conducting layer 208a in the opening 206 remains. Planarization uses chemical mechanical polishing (CMP).

Figure 2F:
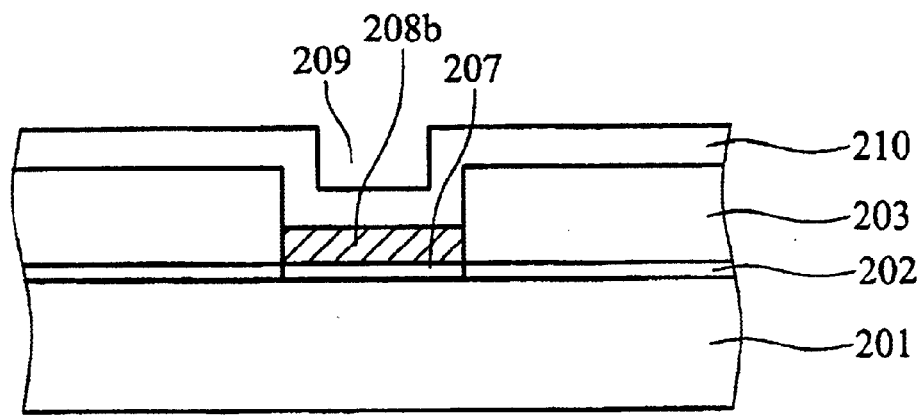

In FIG. 2f, the first conducting layer 208a is etched to form a first conducting layer 208b and an opening 209, wherein the thickness of the first conducting layer 208b is a predetermined thickness determined as required, but does not expose the surface of the gate dielectric layer 207.

An insulating layer 210 is conformally formed on the surface of the hard mask layer 203, such as silicon oxide layer, and the opening 209, wherein the material of the insulating layer 210 is different from that of the hard mask layer 203.

Figure 2G:
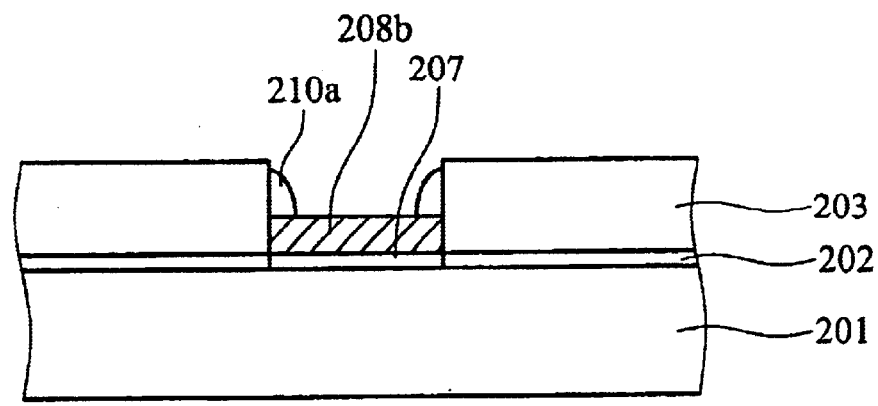

In FIG. 2g, the insulating layer 210 is anisotropically etched to form a first spacer 210a, wherein the hard mask layer 203 is not damaged.

Figure 2H:
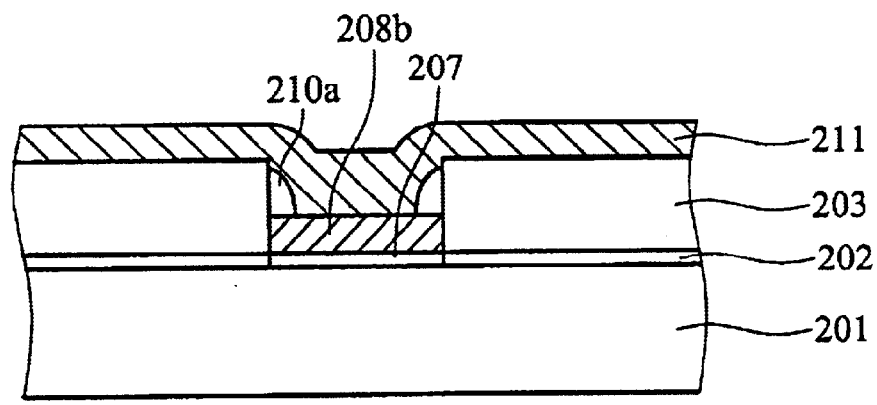

In FIG. 2h, a second conducting layer 211, such as a poly layer, is formed on the surface of the hard mask layer 203, wherein the opening 209 is filled with the second conducting layer 211, and the second conducting layer 211 connects to the exposed first conducting layer 208b.

Figure 2I:
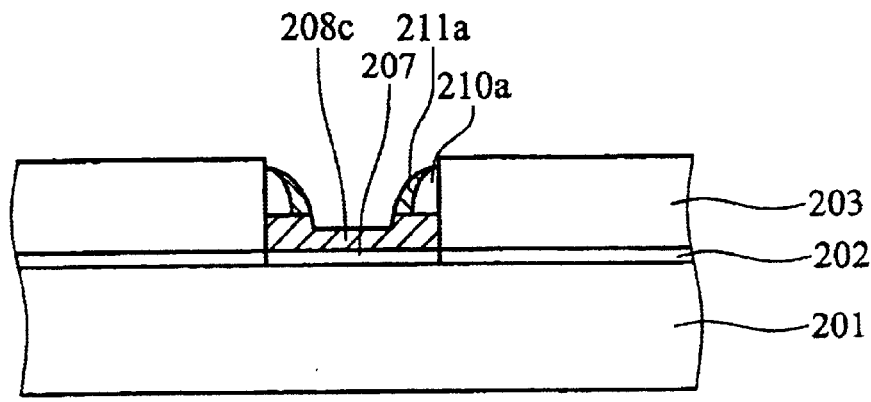

In FIG. 2i, the second conducting layer 211 is anisotropically etched to form a second spacer 211a, and the exposed first conducting layer 208b is etched to a predetermined thickness to form a concave first conducting layer 208c. The second spacer 211a covers the sidewall of the first spacer 210a and connects to the first conducting layer 208c.

Figure 2J:
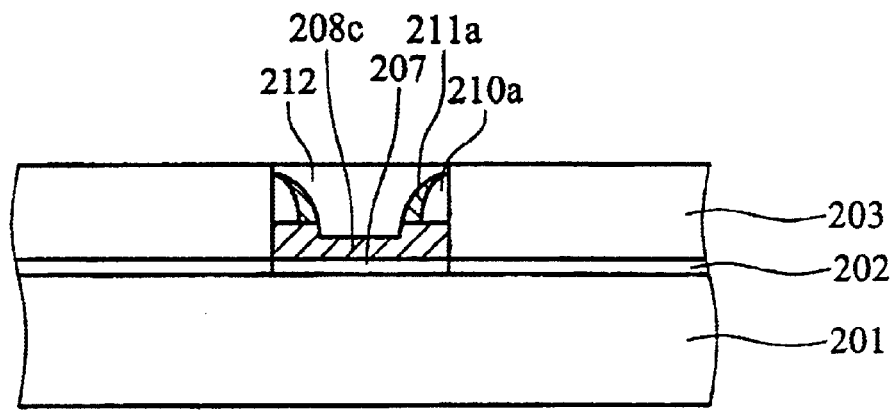

In FIG. 2j, a protecting layer 212, such as a silicon oxide layer, is formed on the hard mask layer 203, wherein the opening 209 is filled with the protecting layer 212, and the material of the protecting layer 212 is different from that of the hard mask layer 203.

Figure 2K:
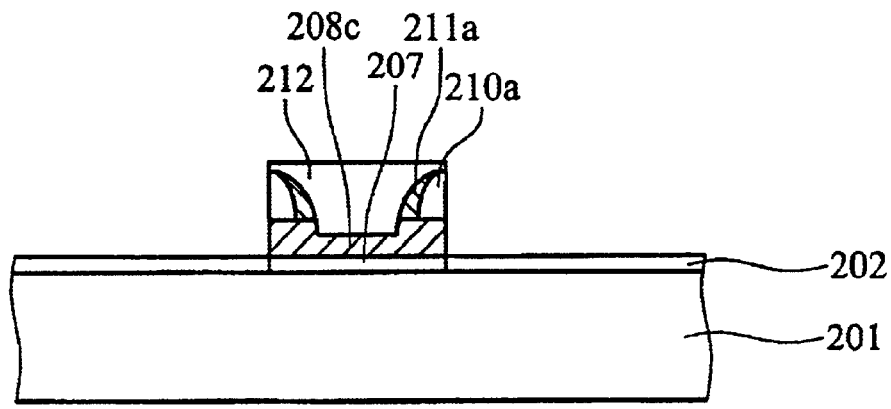

In FIG. 2k, the protecting layer 212 is planarized to expose the surface of the hard mask layer 203, wherein the protecting layer 212 in the opening 209 remains, and the hard mask layer 203 is removed.

Figure 2L:
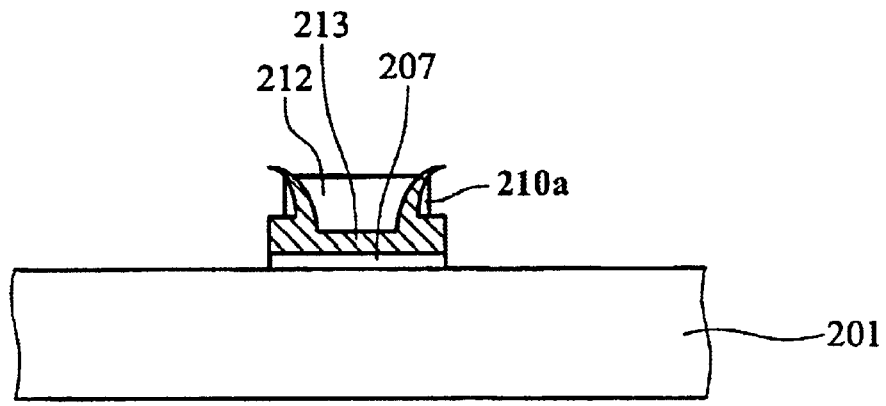

In FIG. 2l, the first oxide layer 202, the portion of protecting layer 212, and the portion of first spacer 210 are removed to expose the end of the second spacer 211a, such that a multi-tip floating gate 213 is provided by the first conducting layer 208c and the second conducting layer 211.

The floating gate 213 comprises a conductive base 208c and a conductive protruding layer 211a. The edge of the conductive base 208c is tip-shaped. The conductive base 208c has a first sidewall and a second sidewall, wherein the fist sidewall is parallel to the second sidewall. The conductive protruding layer 211a is formed on the conductive base 208c, wherein the bottom portion of the conductive protruding layer 211a connects to the top portion of the conductive base 208c, and the bottom portion of the conductive protruding layer 211a is narrower than the top portion of the conductive base 208c. The top portion of the conductive protruding layer 211a is crescent-shaped, and the crescent-shaped structure is aligned with the tip-shaped structure.

Figure 2M:
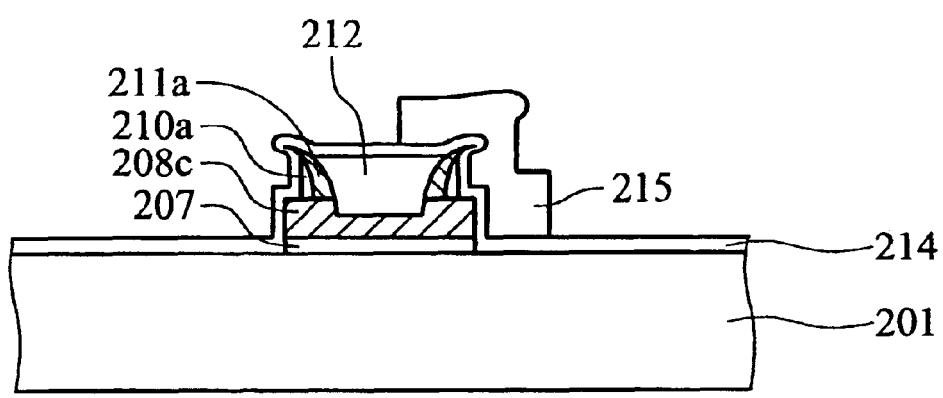

In FIG. 2m, a gate dielectric layer 214, such as oxide layer, and a control gate 215 are sequentially formed on the multi-tip floating gate 213 as shown in FIG. 2l, and fabrication of the flash memory is thus complete.

Electric field concentration easily occurs at the tip, and the point is easily discharged. The effect of point discharge is increased by the floating gate's multiple tips in the present invention. Therefore, data erase for the flash memory having the floating gate with multiple tips is increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a floating gate, comprising:
   providing a semiconductor substrate, wherein a patterned hard mask layer having an opening is formed on the surface of the semiconductor substrate;
   sequentially forming a gate dielectric layer and a first conducting layer with a first predetermined thickness on the bottom surface of the opening;
   forming a spacer on the sidewall of the opening;

forming a conducting spacer on the sidewall of the spacer;

etching the first conducting layer to a second predetermined thickness; wherein a multi-tip floating gate is provided by the first conducting layer and the conducting spacer;

forming a protecting layer in the opening;

removing the patterned hard mask layer; and removing the and portions of the protecting layer and the first spacer to expose the surface of the first conducting layer.

2. The method for forming a floating gate of claim 1, wherein the patterned hard mask layer is a silicon nitride layer.

3. The method for forming a floating gate of claim 1, wherein the gate dielectric layer is a gate oxide layer.

4. The method for forming a floating gate of claim 1, wherein the first conducting layer is a poly layer.

5. The method for forming a floating gate of claim 1, wherein the spacer is an insulating layer.

6. The method for forming a floating gate of claim 5, wherein the insulating layer is a silicon oxide layer.

7. The method for forming a floating gate of claim 5, wherein the material of the insulating layer is different from that of the patterned hard mask layer.

8. The method for forming a floating gate of claim 1, wherein the conducting spacer is a poly layer.

9. The method for forming a floating gate of claim 1, wherein the protecting layer is an oxide layer.

10. The method for forming a floating gate of claim 1, wherein the material of the protecting layer and the spacer are the same.

11. A method for forming a floating gate, comprising:

providing a semiconductor substrate;

sequentially forming a dielectric layer, a hard mask layer, and a patterned resist layer on the semiconductor substrate;

etching the hard mask layer to form an opening in the hard mask layer using the patterned resist layer as a mask, wherein the opening exposes the surface of the semiconductor substrate;

removing the patterned resist layer;

forming a gate dielectric layer on the exposed surface of the semiconductor substrate;

forming a first poly layer on the hard mask layer, wherein the opening is filled with the first poly layer;

chemical mechanical polishing the first poly layer to expose the surface of the hard mask layer;

etching the first poly layer in the opening to a first predetermined thickness;

conformally forming an insulating layer on the surface of the hard mask layer and the opening;

anisotropically etching the insulating layer to form a first spacer on a sidewall of the opening;

conformally forming a second poly layer on the surface of the hard mask layer and the opening;

anisotropically etching the second poly layer to form a second spacer on a sidewall of the first spacer, wherein the second spacer covers the surface of the first spacer;

etching the first poly layer to a second predetermined thickness, wherein a multi-tip floating gate is provided by the first poly layer and the second spacer;

forming a protecting layer in the opening;

removing the dielectric layer; and removing portions of the protecting layer and the first spacer to expose the surface of the first poly layer.

12. The method for forming a floating gate of claim 11, wherein the dielectric layer is a pad oxide layer.

13. The method for forming a floating gate of claim 11, wherein the hard mask layer is a nitride layer.

14. The method for forming a floating gate of claim 11, wherein the gate dielectric layer is a gate oxide layer.

15. The method for forming a floating gate of claim 11, wherein the insulating layer is a silicon oxide layer.

16. The method for forming a floating gate of claim 11, wherein the material of the insulating layer is different from that of the hard mask layer.

17. The method for forming a floating gate of claim 11, wherein the protecting layer is a silicon oxide layer.

18. The method for forming a floating gate of claim 11, wherein the material of the protecting layer is different from that of the hard mask layer.

19. The method for forming a floating gate of claim 11, wherein the materials of the protecting layer and the insulating layer are the same.

* * * * *